(12) United States Patent
Biberger et al.

(10) Patent No.: US 9,190,242 B2
(45) Date of Patent: Nov. 17, 2015

(54) PARTICLE BEAM DEVICE HAVING A SAMPLE HOLDER

(75) Inventors: Josef Biberger, Wildenberg (DE); Ralph Pulwey, Aalen (DE)

(73) Assignee: Carl Zeiss NTS GmbH, Oberkochen (DE)

(*) Notice: Subject to any disclaimer, the term of this patent is extended or adjusted under 35 U.S.C. 154(b) by 68 days.

(21) Appl. No.: 13/239,535

(22) Filed: Sep. 22, 2011

(65) Prior Publication Data

US 2012/0074320 A1 Mar. 29, 2012

(30) Foreign Application Priority Data

Sep. 29, 2010 (DE) .................. 10 2010 041 678

(51) Int. Cl.
*H01J 37/20* (2006.01)
*H01J 37/28* (2006.01)

(52) U.S. Cl.
CPC .............. *H01J 37/28* (2013.01); *H01J 37/20* (2013.01); *H01J 2237/201* (2013.01); *H01J 2237/20207* (2013.01); *H01J 2237/20214* (2013.01); *H01J 2237/20221* (2013.01); *H01J 2237/20285* (2013.01); *H01J 2237/20292* (2013.01)

(58) Field of Classification Search
CPC ........................................................ H01J 37/28
USPC ............................................. 250/442.11, 310
See application file for complete search history.

(56) References Cited

U.S. PATENT DOCUMENTS

| | | | |
|---|---|---|---|
| 4,733,087 A * | 3/1988 | Narita et al. ............. 250/442.11 |
| 6,388,262 B1 * | 5/2002 | Alani et al. .............. 250/442.11 |
| 6,872,955 B1 | 3/2005 | Balcome et al. |
| 7,297,944 B2 * | 11/2007 | Kodama et al. ............... 250/304 |
| 7,705,324 B2 * | 4/2010 | Miyazaki et al. ......... 250/442.11 |
| 7,718,981 B2 * | 5/2010 | Takahashi et al. ........ 250/492.21 |
| 2001/0006213 A1 * | 7/2001 | Iulita ............................. 250/310 |
| 2008/0029492 A1 | 2/2008 | Adachi |
| 2008/0073577 A1 * | 3/2008 | Relleen et al. ........... 250/492.21 |
| 2008/0173813 A1 * | 7/2008 | Van De Water et al. ...... 250/307 |
| 2009/0014648 A1 | 1/2009 | Zeile et al. |
| 2009/0045339 A1 | 2/2009 | Harada et al. |
| 2010/0008563 A1 | 1/2010 | Fujii et al. |
| 2010/0059672 A1 | 3/2010 | Zeile |
| 2010/0230584 A1 * | 9/2010 | Niebel et al. ............... 250/252.1 |
| 2011/0115637 A1 * | 5/2011 | Kikuchi et al. ............... 340/600 |

FOREIGN PATENT DOCUMENTS

| | | |
|---|---|---|
| DE | 10 2007 026 847 A1 | 12/2008 |
| EP | 1 780 764 A1 | 5/2007 |
| JP | 2002 319364 A | 10/2002 |

* cited by examiner

*Primary Examiner* — Jack Berman
*Assistant Examiner* — Eliza Osenbaugh-Stewar
(74) *Attorney, Agent, or Firm* — Muirhead and Saturnelli, LLC

(57) ABSTRACT

A particle beam device and a sample receptacle apparatus, which has a sample holder, are disclosed. The sample holder is arranged in a movable fashion along at least a first axis and along at least a second axis. Furthermore, the sample holder is arranged in a rotatable fashion about a first axis of rotation and about a second axis of rotation. A first sample holding device is arranged relative to the sample holder in a rotatable fashion about a third axis of rotation, in which the third axis of rotation and the second axis of rotation are at least in part arranged laterally offset with respect to one another. Furthermore, a control apparatus is provided, in which the first sample holding device is rotatable about the third axis of rotation into an analysis position and/or treating position using the control apparatus.

26 Claims, 8 Drawing Sheets

PARTICLE BEAM DEVICE HAVING A SAMPLE HOLDER

TECHNICAL FIELD

This application relates to a particle beam device, more particularly an electron beam device or an ion beam device, which has a sample holder. This application also relates to a particle beam device with two particle beam columns, more particularly with an electron beam column and with an ion beam column, in which the particle beam device is provided with a sample holder.

BACKGROUND OF THE INVENTION

Electron beam devices, more particularly a scanning electron microscope (also referred to as an SEM herein), are used to analyze samples in order to obtain information in respect of the properties and behavior of these samples in specific conditions.

In an SEM, an electron beam (also called primary electron beam herein) is generated using a beam generator and focused onto a sample to be analyzed using a beam guiding system, more particularly an objective lens. The primary electron beam is guided in a raster-like fashion over a surface of the sample to be analyzed using a deflection apparatus. In the process, the electrons of the primary electron beam interact with the material of the sample to be analyzed. Interaction particles in particular are created as a result of the interaction. Electrons in particular are emitted by the sample to be analyzed (so-called secondary electrons) and electrons of the primary electron beam are backscattered on the sample to be analyzed (so-called backscattered electrons). The secondary electrons and backscattered electrons are detected and used for generating an image. Hence, an image of the sample to be analyzed is obtained.

Furthermore, the prior art has disclosed the use of combination devices for analyzing samples, in which devices both electrons and ions can be guided onto a sample to be analyzed. By way of example, it is known to additionally equip an SEM with an ion beam column. Ions are generated using an ion beam generator arranged in the ion beam column and these are used for preparing a sample (e.g. for removing a layer of the sample or for applying material onto the sample) or else for imaging. Here, the SEM more particularly serves for observing the preparation, but also for the further analysis of the prepared or unprepared sample.

The prior art has furthermore disclosed the practice of providing a particle beam device with a sample holder in the form of a sample stage, on which a sample to be analyzed and/or treated is arranged. The sample holder is embodied in a movable fashion, wherein the movable embodiment of the sample holder is made possible by a plurality of movement elements. The movement elements allow a movement of the sample stage in at least one specific direction. In particular, a sample holder is known that has a plurality of translational movement elements (for example in the form of linear drives) and a plurality of rotational movement elements. By way of example, a sample holder is known, which is arranged in a movable fashion along a first axis of translation (for example an x-axis), along a second axis of translation (for example a y-axis) and along a third axis of translation (for example a z-axis). The first axis of translation, the second axis of translation and the third axis of translation are arranged perpendicularly with respect to one another. The known sample holder can additionally also be rotated about a first axis of rotation and about a second axis of rotation, wherein the first axis of rotation and the second axis of rotation are oriented perpendicularly with respect to one another.

In respect of the aforementioned prior art, reference is made in an exemplary fashion to EP 1 780 764 A1, which is incorporated herein by reference.

Furthermore, reference is made in an exemplary fashion to US 2010/0059672 A1 and DE 10 2007 026 847 A1, which are incorporated herein by reference, from each of which a particle beam device is known that has a sample holder that can be brought into an analysis position and/or treating position using a rotation.

The known sample holder can have a sample holding device, on which the sample to be analyzed is arranged. Additionally, the known sample holder can have further sample holding devices, on each of which a further sample to be analyzed is arranged. The sample holding devices, respectively, have a planar sample receptacle surface and respectively have a holding element. The holding element of each sample holding device is in each case introduced into an opening of the sample holder. By way of example, the holding element is held in said opening in a detachable fashion using a screw connection.

The sample holder with the numerous sample holding devices is used in order to be able to analyze a large number of samples to be analyzed within a relatively short period of time. In order to align a specific sample to be analyzed in a desired orientation, it is known to move the sample holder eucentrically. However, it is quite possible that during the eucentric movement of the sample holder parts of the sample holder collide with units of the particle beam device, which are arranged in a sample chamber of the particle beam device with the sample holder.

The aforementioned premise is particularly likely to occur in a combination device provided with two particle beam columns. By way of example, provision is made in such a combination device for a sample to be analyzed and/or treated to be arranged in the vicinity of a point of coincidence of a first particle beam and a second particle beam in order to carry out an analysis and/or treating of the sample to be analyzed and/or treated. FIG. 1A shows a schematic illustration of a particle beam device from the prior art. The particle beam device has a first particle beam column 1 and a second particle beam column 2. Furthermore, provision is made for a sample holder 3, which—as described above—has a movable embodiment. A first sample holding device 4 and a second sample holding device 5 are arranged on the sample holder 3. A first sample 6A, which should be analyzed and/or treated, is arranged on the first sample holding device 4. A first particle beam 7 provided by the first particle beam column 1 and a second particle beam 8 provided by the second particle beam column 2 meet at a point of coincidence 9 on the first sample 6A. In order to allow an analysis and/or treating at the point of coincidence 9, provision is made for arranging the first sample holding device 4 as closely to an edge of the sample holder 3 as possible, wherein the edge of the sample holder 3 is arranged closest to the first particle beam column 1 and the second particle beam column 2. Furthermore, the first sample holding device 4 was arranged manually (i.e. by hand) on the sample holder 3 such that the first sample 6A has an orientation that suffices for the analysis and/or treating of the first sample 6A using the first particle beam 7 or the second particle beam 8. However, the alignment by hand is complicated. Moreover, such an alignment is often inaccurate. Accordingly, carrying out an analysis of a plurality of samples, which are arranged on the sample holder by the sample holding devices, may be time-consuming and inaccurate.

Furthermore, it is quite possible for a further sample to be analyzed and/or treated to be arranged on the sample holder 3. This is illustrated in FIG. 1B. In order to analyze and/or treat a second sample 6B arranged on the second sample holding device 5, the sample holder 3 is moved such that the second sample 6B is arranged in the vicinity of the point of coincidence 9. However, in the process the first sample holding device 4 may now strike e.g. the first particle beam column 1.

At least one of the aforementioned sample holding devices may also collide with parts of the particle beam device during a rotation of the sample holder 3 about an axis of rotation. This is illustrated in FIG. 1C. When the sample holder 3 rotates about an axis that is parallel to the optical axis of the second particle beam column 2, the second sample holding device 5 may strike the first particle beam column 1.

Accordingly, it would be desirable to specify a sample holder with a sample holding device, and a particle beam device with a sample holder, in which a sample in the sample holder or a unit of the sample holder is prevented from striking a component of the particle beam device when an analysis position and/or treating position of a sample is set, and in which an analysis of numerous samples is possible without consuming much time.

SUMMARY OF THE INVENTION

The particle beam device according to the system described herein has a sample chamber. Furthermore, the particle beam device according to the system described herein is provided with a first particle beam column that has a first optical axis. The first particle beam column has a first beam generator for generating a first particle beam and a first objective lens for focusing the first particle beam. Moreover, provision is made in the particle beam device according to the system described herein for at least one detector for detecting interaction particles that are created as a result of interactions between the first particle beam with a first sample when the first particle beam impinges on the first sample that is to be arranged in the sample chamber. More particularly, provision is now made for the first particle beam to be guided in a raster-like fashion over the surface of the first sample using a deflection apparatus. To this end, the surface of the first sample should lie in an area to which the first particle beam can be guided using the deflection apparatus. This area is also referred to as a raster area. Provision is not made here for guiding the first particle beam outside of the raster area. The particles of the first particle beam interact with the material from the first sample in the case of the raster-like feed. Interaction particles are created as a result of the interaction. By way of example, electrons are emitted by the first sample (so-called secondary electrons) and/or electrons are backscattered from the first sample (so-called backscattered electrons). The secondary electrons and backscattered electrons are then detected by the detector and used to generate an image. Hence an image of the first sample is obtained.

Arranged in the sample chamber is a first sample holding device, which is embodied to hold a sample, for example a first sample. The first sample holding device in turn is arranged on a sample holder, which for example is embodied as a sample stage. In one embodiment, provision is made for the first sample holding device to be detachably arranged on the sample holder. The sample holder is arranged in a movable fashion along at least a first axis (for example an x-axis) and along at least a second axis (for example a y-axis). The first axis and the second axis are arranged at a first angle with respect to one another, which differs from 0° and 180°. Accordingly, provision is made for the first axis and the second axis not to be arranged parallel to one another or coaxially with respect to one another. By way of example, the first angle lies in a region between approximately 45° and approximately 135° (with the region boundaries of the aforementioned region also being included). By way of example, provision is made for the first axis and the second axis to be oriented perpendicular to one another. Moreover, the sample holder is arranged in a rotatable fashion about at least a first axis of rotation and about at least a second axis of rotation, wherein the first axis of rotation and the second axis of rotation are oriented at a second angle with respect to one another, which differs from 0° and 180°. Accordingly, provision is made for the first axis of rotation and the second axis of rotation not to be arranged parallel to one another or coaxially with respect to one another. By way of example, the second angle lies in a region between approximately 45° and approximately 135° (with the region boundaries of the aforementioned region also being included). By way of example, provision is made for the first axis of rotation and the second axis of rotation to be oriented perpendicular to one another.

The first sample holding device is arranged relative to the sample holder in a rotatable fashion about a third axis of rotation. Expressed differently, the first sample holding device is rotatable with respect to the sample holder; to be precise about the third axis of rotation. Here, the third axis of rotation and the second axis of rotation are at least in part arranged laterally offset with respect to one another, for example arranged completely laterally offset with respect to one another. Expressed differently, the third axis of rotation and the second axis of rotation are not identical, but are arranged next to one another. Furthermore, provision is for example made for the third axis of rotation to be oriented parallel to one of the following axes, namely the first axis, the second axis, the first axis of rotation and the second axis of rotation. As an alternative thereto, provision is made for the third axis of rotation to include an angle, which is not 0° and is not 180°, with at least one of the following axes, namely the first axis, the second axis, the first axis of rotation and the second axis of rotation.

Furthermore, provision is made on the particle beam device according to the system described herein for a control apparatus, wherein the first sample holding device is rotatable about the third axis of rotation into an analysis position and/or treating position using the control apparatus. It is possible to analyze and/or treat the first sample, more particularly using the first particle beam, in the analysis position and/or treating position.

An advantage of the system described herein is that an additional degree of freedom is created by the rotation of the first sample holding device relative to the sample holder about the third axis of rotation, and so a first sample arranged on the first sample holding device can be positioned sufficiently well with respect to the first particle beam for the purpose of an analysis and/or treating. In principle, the system described herein allows an increase in the flexibility when positioning the first sample with respect to the first particle beam. More particularly, it is ensured that the first sample can in principle be aligned relative to the first optical axis by a rotation of the sample holder about the second axis of rotation. Thereupon it is possible to undertake a fine adjustment of the position of the first sample in respect of the first optical axis and/or an alignment of the first sample with respect to the raster area of the first particle beam column by rotating the first sample holding device about the third axis of rotation.

In particular, the system described herein is also advantageous when the particle beam device is used to carry out a method in which a different alignment of the first sample is required. By way of example, this is envisaged in the production of a plurality of TEM lamellae, which should be prepared from a sample and should in each case have a different orientation. In this case, it is not necessary during the production of such TEM lamellae for the first sample holding device with the first sample to be detached a number of times from the sample holder and for the first sample holding device to be reattached to the sample holder, with a realignment of the first sample being carried out in the process. In the aforementioned case, provision is made for the sample chamber firstly to be ventilated, the first sample holding device to be detached and to be newly aligned, and for the sample chamber to be pumped out again in order to generate a vacuum. This time-consuming procedure is avoided in the case of the system described herein.

In one embodiment of the particle beam device according to the system described herein provision is alternatively or additionally made for the third axis of rotation and the second axis of rotation to be arranged separated laterally from one another. Expressed differently, provision is made for these to be arranged or oriented next to one another such that the third axis of rotation and the second axis of rotation do not intersect. By way of example—as mentioned above—provision is made for the third axis of rotation and the second axis of rotation to be aligned parallel to one another. As an alternative thereto, provision is made for the third axis of rotation and the second axis of rotation to be arranged laterally with respect to one another but to intersect at a point.

In a further embodiment of the particle beam device according to the system described herein, provision is alternatively or additionally made for the sample holder to be arranged in a movable fashion along at least a third axis (for example a z-axis). More particularly, provision is made for the first axis and the third axis to be arranged at a third angle with respect to one another, which differs from 0° and 180°. Additionally or alternatively thereto, provision is made for the second axis and the third axis to be arranged at a fourth angle with respect to one another, which differs from 0° and 180°. Accordingly, the system described herein provides for the first axis, the second axis and the third axis not to be arranged coaxially or parallel to one another. By way of example, at least one of the following angles, namely the first angle, the third angle and the fourth angle lies in a region between approximately 45° and approximately 135° (with the region boundaries of the aforementioned region also being included). By way of example, provision is made for the first axis, the second axis and the third axis to be arranged perpendicular to one another. Furthermore, provision is for example made for the third axis of rotation to be oriented parallel to the third axis. As an alternative thereto, provision is made for the third axis of rotation to include an angle with the third axis, which is not 0° and is not 180°.

In one embodiment of the particle beam device according to the system described herein, provision is alternatively or additionally made for the first sample holding device to be arranged on a first movement apparatus. This first movement apparatus is used to rotate the first sample holding device about the third axis of rotation. By way of example, the first movement apparatus is embodied as a mechanical and/or electronic apparatus. Thus, for example, one embodiment provides for the first movement apparatus to comprise a gear-wheel drive, by which the first sample holding device is driven such that the latter rotates about the third axis of rotation.

In a further embodiment, provision is alternatively or additionally made for the control apparatus to be connected to the first movement apparatus for moving the first sample holding device. In this case, the connection between the control apparatus and the first movement apparatus may for example be embodied mechanically, electronically and/or optically. By way of example, an illuminant and a light sensor are provided as an optical connection. By way of example, provision is made in one embodiment for the control apparatus to be provided with an illuminant, by which at least one light signal for controlling the first movement apparatus is sent to a light sensor that is arranged on the first movement apparatus.

In a further embodiment of the particle beam device according to the system described herein, provision is additionally or alternatively made for the first sample holding device to be arranged in such a moveable fashion that a eucentric movement of the first sample holding device is given. Above and also below, a eucentric movement is understood to mean a movement in which the center of a generated image is a fixed point during the movement.

In a further embodiment of the particle beam device according to the system described herein, provision is additionally or alternatively made in the particle beam device for the first sample holding device to be arranged in such a movable fashion that when the first sample holding device is moved a first predetermined position on a first sample remains stationary relative to the first optical axis of the first particle beam column.

In a further embodiment of the particle beam device according to the system described herein, provision is additionally or alternatively made for the particle beam device to have at least a second sample holding device which is arranged on the sample holder. By way of example, the second sample holding device is arranged in a detachable fashion on the sample holder. The second sample holding device is embodied for holding a second sample. Hence the system described herein is not restricted to only a single sample holding device being arranged on the sample holder. Rather, the system described herein also provides for at least two or more sample holding devices to be arranged on the sample holder. The aforementioned second sample holding device is arranged relative to the sample holder in a rotatable fashion about a fourth axis of rotation. Expressed differently, the second sample holding device is rotatable relative to the sample holder; to be precise about the fourth axis of rotation. Here, the fourth axis of rotation, the third axis of rotation and the second axis of rotation are at least partly arranged laterally offset with respect to one another, for example arranged completely laterally offset with respect to one another. Expressed differently, they are not identical. Rather, they are arranged next to one another. Furthermore, provision is for example made for the fourth axis of rotation to be oriented parallel to one of the following axes, namely the first axis, the second axis, the third axis, the first axis of rotation, the second axis of rotation and the third axis of rotation. As an alternative thereto, provision is made for the fourth axis of rotation to include an angle, which is not 0° and is not 180°, with at least one of the following axes, namely the first axis, the second axis, the third axis, the first axis of rotation, the second axis of rotation and the third axis of rotation.

In a further embodiment of the particle beam device according to the system described herein, provision is alternatively or additionally made for the fourth axis of rotation, the third axis of rotation and the second axis of rotation to be arranged separated laterally from one another. Expressed differently, provision is made for the fourth axis of rotation, the third axis of rotation and the second axis of rotation to be arranged or oriented next to one another such that the fourth axis of rotation, the third axis of rotation and the second axis of rotation do not intersect. By way of example, provision is made for the fourth axis of rotation, the third axis of rotation and the second axis of rotation to be aligned parallel to one another. As an alternative thereto, provision is made for the fourth axis of rotation, the third axis of rotation and the second axis of rotation to be arranged laterally with respect to one another but to intersect at a point.

The use of a plurality of sample holding devices, which are arranged on the sample holder, is advantageous in the case of the system described herein. The system described herein then firstly allows a sample to be interchanged without having to remove the sample holder or one of the sample holding devices from the sample chamber. Secondly, the risk of a collision of one of the sample holding devices with a component of the particle beam device is avoided. By way of example, if the plurality of sample holding devices are arranged on the sample holder in a circular fashion, a first rotation of the sample holder about the second axis of rotation may for example bring about a sample interchange. Expressed differently, the first sample holding device or the second sample holding device with a sample to be analyzed is brought into a particular relative position with respect to the first optical axis. Subsequently, a rotation of the first sample holding device about the third axis of rotation or a rotation of the second sample holding device about the fourth axis of rotation brings about a relatively quick alignment of the first sample or the second sample with respect to the raster area of the first particle beam column. At the same time, the risk of the sample holder or the first sample holding device or second sample holding device striking components of the particle beam device is reduced.

Furthermore, the system described herein does not necessarily require aligning the first sample holding device or the second sample holding device by hand in order to obtain a sufficient orientation of the first sample or the second sample with respect to the raster area of the first particle beam column. The sufficient orientation can be provided by setting the position of the first sample or the second sample with respect to the first particle beam by rotating the first sample holding device about the third axis of rotation or using rotating the second sample holding device about the fourth axis of rotation.

Moreover, provision is additionally or alternatively made for the second sample holding device to be arranged on a second movement apparatus. The second movement apparatus is used to rotate the second sample holding device about the fourth axis of rotation. By way of example, the second movement apparatus is embodied as a mechanical and/or electronic apparatus. A further embodiment for example also provides for the second movement apparatus to comprise a gearwheel drive, by which the second sample holding device is driven such that the latter rotates about the fourth axis of rotation.

In a further embodiment in turn, provision is alternatively or additionally made for the control apparatus to be connected to the second movement apparatus for moving the second sample holding device. In this case, the connection between the control apparatus and the second movement apparatus may for example also be embodied mechanically, electronically and/or optically. In respect of an optical connection, provision can also be made in this case for the control apparatus to be provided with an illuminant, and in which at least one light signal for controlling the second movement apparatus is sent to a light sensor which is arranged on the second movement apparatus.

In a further embodiment of the particle beam device according to the system described herein, provision is additionally or alternatively made for the control apparatus to be connected to both the first movement apparatus and the second movement apparatus. In a further embodiment in turn, provision is additionally or alternatively made for at least one of the connections between the control apparatus and one of the two movement apparatuses to be embodied e.g. mechanically, electronically and/or optically. The aforementioned embodiments allow the control apparatus to be used to control firstly the rotation of the first sample holding device about the third axis of rotation. Secondly, the control apparatus can control the rotation of the second sample holding device about the fourth axis of rotation. Reference is explicitly made to the fact that the system described herein is not restricted to this and that the number of control apparatuses may be selected in a suitable fashion. Thus, in one alternative embodiment provision is made for the rotation of the first sample holding device to be controlled by a first control apparatus and the rotation of the second sample holding device to be controlled by a second control apparatus.

In a further embodiment in turn, provision is additionally or alternatively made for the first movement apparatus and the second movement apparatus to be formed by a single movement unit. By way of example, this single movement unit is embodied as a drive unit, which is connected firstly to the first sample holding device and secondly to the second sample holding device using mechanical components such that both the first sample holding device and the second sample holding device can be moved using the drive unit.

In one embodiment of the particle beam device according to the system described herein, provision is alternatively or additionally made for the first particle beam column to be embodied as an electron beam column or as an ion beam column. If the first particle beam column is embodied as an electron beam column, the first beam generator generates an electron beam as first particle beam. However, if the first particle beam column is embodied as an ion beam column, the first beam generator generates an ion beam as first particle beam. The first objective lens focuses the first particle beam onto the first sample or the second sample. In the case of an interaction between the first particle beam and the first sample or the second sample, interaction particles are created and these can be detected by the detector. In the case of the interaction between the first particle beam in the form of an electron beam and the first sample or the second sample interaction particles, more particularly in the form of secondary electrons and backscattered electrons, are created, which can be used for generating an image.

In a further embodiment of the particle beam device according to the system described herein, provision is additionally or alternatively made for the particle beam device to have a second particle beam column with a second optical axis. The second particle beam column has a second beam generator for generating a second particle beam and a second objective lens, which for example serves for focusing the second particle beam, for example onto the first sample or onto the second sample. More particularly, provision is made for the first particle beam column to be embodied as an electron beam column and for the second particle beam column to be embodied as an ion beam column. In a further embodiment of the particle beam device according to the system described herein, provision is alternatively made for the first particle beam column to be embodied as an ion beam column and for the second particle beam column to be embodied as an electron beam column. In a further embodiment, in turn, of the particle beam device according to the system described herein, provision is made for both the first particle beam column and the second particle beam column to each be embodied as an ion beam column. In a further alternative embodiment in turn, provision is made for both the first particle beam column and the second particle beam column to each be embodied as an electron beam column.

In a further embodiment of the particle beam device according to the system described herein, provision is alternatively or additionally made for the first sample holding device to be arranged in such a movable fashion that when the first sample holding device is moved a second predetermined position on a sample, for example on the first sample, remains stationary relative to the second optical axis of the second particle beam column.

By way of example, provision is, in the process, made for the aforementioned first predetermined position on the first sample and the second predetermined position on the first sample to be identical.

In a further embodiment in turn of the particle beam device according to the system described herein, provision is additionally or alternatively made for the second sample holding device to be arranged in such a movable fashion that when the second sample holding device is moved a third predetermined position on a sample, for example on the second sample, remains stationary relative to the first optical axis of the first particle beam column.

In a further embodiment of the particle beam device according to the system described herein, provision is additionally or alternatively made for the second sample holding device to be arranged in such a movable fashion that when the second sample holding device is moved a fourth predetermined position on a sample, for example on the second sample, remains stationary relative to the second optical axis of the second particle beam column.

By way of example, provision is, in the process, made for the third predetermined position on the second sample, already mentioned above, and the fourth predetermined position on the second sample to be identical.

The system described herein also relates to a sample receptacle apparatus, more particularly for a particle beam device, which for example has one of the aforementioned features or a combination of at least two of the aforementioned features. The sample receptacle apparatus can in the process likewise have one of the aforementioned features or a combination of at least two of the aforementioned features.

The sample receptacle apparatus according to the system described herein has at least a first sample holding device for holding a first sample and also at least one sample holder, on which the first sample holding device is arranged. The sample holder is arranged in a movable fashion along at least a first axis (for example an x-axis) and along at least a second axis (for example a y-axis). The first axis and the second axis are arranged at a first angle with respect to one another, which differs from 0° and 180°. Accordingly, provision is made for the first axis and the second axis not to be arranged parallel to one another or coaxially with respect to one another. By way of example, the first angle lies in a region between approximately 45° and approximately 135° (with the region boundaries of the aforementioned region also being included). By way of example, provision is made for the first axis and the second axis to be oriented perpendicular to one another. Furthermore, the sample holder is arranged in a rotatable fashion about at least a first axis of rotation and about at least a second axis of rotation, wherein the first axis of rotation and the second axis of rotation are arranged at a second angle with respect to one another, which differs from 0° and 180°. Accordingly, provision is made for the first axis of rotation and the second axis of rotation not to be arranged parallel to one another or coaxially with respect to one another. By way of example, the second angle lies in a region between approximately 45° and approximately 135° (with the region boundaries of the aforementioned region also being included). By way of example, provision is made for the first axis of rotation and the second axis of rotation to be oriented perpendicular to one another. Moreover, the first sample holding device is arranged relative to the sample holder in a rotatable fashion about a third axis of rotation. Accordingly, the first sample holding device is rotatable relative to the sample holder; to be precise about the third axis of rotation. The third axis of rotation and the second axis of rotation are at least in part arranged laterally offset with respect to one another.

Furthermore, a control apparatus is provided on the sample receptacle apparatus according to the system described herein, wherein the first sample holding device is rotatable about the third axis of rotation into an analysis position and/or treating position using the control apparatus. In the analysis position and/or treating position, the first sample can be analyzed and/or treated using a particle beam in particular.

In respect of the advantages of the sample receptacle apparatus according to the system described herein, reference is made to the advantages, already mentioned above, of the particle beam device according to the system described herein.

In one embodiment of the sample receptacle apparatus according to the system described herein, provision is alternatively or additionally made for the third axis of rotation and the second axis of rotation to be arranged separated laterally from one another. Expressed differently, provision is made for these to be arranged or oriented next to one another such that the third axis of rotation and the second axis of rotation do not intersect. By way of example, provision is made for the third axis of rotation and the second axis of rotation to be aligned parallel to one another. As an alternative thereto, provision is made for the third axis of rotation and the second axis of rotation to be arranged laterally with respect to one another but to intersect at a point. Furthermore, provision is for example made for the third axis of rotation and the second axis of rotation to include an angle, which is not 0° and is not 180°.

In a further embodiment of the sample receptacle apparatus according to the system described herein, provision is alternatively or additionally made for the sample holder to be arranged in a movable fashion along at least a third axis (for example a z-axis). More particularly, provision is made for the first axis and the third axis to be arranged at a third angle with respect to one another, which differs from 0° and 180°. In addition or as an alternative thereto, provision is made for the second axis and the third axis to be arranged at a fourth angle with respect to one another, which is arranged to differ from 0° and 180°. Accordingly, the system described herein provides for the first axis, the second axis and the third axis not to be arranged coaxially or parallel to one another. By way of example, at least one of the following angles, namely the first angle, the third angle and the fourth angle lies in a region between approximately 45° and approximately 135° (with the region boundaries of the aforementioned region also being included). By way of example, provision is made for the first axis, the second axis and the third axis to be arranged perpendicular to one another.

In a further embodiment, provision is made for the third axis of rotation to be oriented parallel to one of the following axes, namely the first axis, the second axis, the third axis and the first axis of rotation. As an alternative thereto, provision is made for the third axis of rotation to include an angle, which differs from 0° and differs from 180°, with at least one of the following axes, namely the first axis, the second axis, the third axis and the first axis of rotation.

In one embodiment of the sample receptacle apparatus according to the system described herein, provision is additionally or alternatively made for the first sample holding device to be arranged on a first movement apparatus. The first movement apparatus is used to rotate the first sample holding device about the third axis of rotation. By way of example, the first movement apparatus is embodied as a mechanical and/or electronic apparatus. A further embodiment for example also provides for the first movement apparatus to comprise a gearwheel drive, by which the first sample holding device is driven such that the latter rotates about the third axis of rotation.

In a further embodiment of the sample receptacle apparatus according to the system described herein, at least a second sample holding device is arranged on the sample holder. A second sample can be arranged on the second sample holding device. Hence the sample receptacle apparatus according to the system described herein is also not restricted to only a single sample holding device being arranged on the sample holder. Rather, provision is also made for arranging at least two or more sample holding devices on the sample holder. The aforementioned second sample holding device is arranged relative to the sample holder in a rotatable fashion about a fourth axis of rotation. Expressed differently, the second sample holding device is rotatable relative to the sample holder; to be precise about the fourth axis of rotation. Furthermore, provision is made for the fourth axis of rotation, the third axis of rotation and the second axis of rotation to be at least partly arranged laterally offset with respect to one another. In a further embodiment, provision is made for the fourth axis of rotation, the third axis of rotation and the second axis of rotation to be arranged separated laterally from one another. Expressed differently, provision is made for the fourth axis of rotation, the third axis of rotation and the second axis of rotation to be arranged or oriented next to one another such that the fourth axis of rotation, the third axis of rotation and the second axis of rotation do not intersect. By way of example, provision is made for the fourth axis of rotation, the third axis of rotation and the second axis of rotation to be aligned parallel to one another. As an alternative to this, provision is made for the fourth axis of rotation, the third axis of rotation and the second axis of rotation to be arranged laterally with respect to one another but to intersect at a point. They include an angle, which differs from 0° and 180°, with respect to one another.

In the case of the sample receptacle apparatus according to the system described herein, provision is also additionally or alternatively made for the second sample holding device to be arranged on a second movement apparatus. The second movement apparatus is used to rotate the second sample holding device about the fourth axis of rotation. By way of example, the second movement apparatus is embodied as a mechanical and/or electronic apparatus. A further embodiment for example also provides for the second movement apparatus to comprise a gearwheel drive, by which the second sample holding device is driven such that the latter rotates about the fourth axis of rotation.

In a further embodiment in turn, provision is alternatively or additionally made for the control apparatus to be connected to the second movement apparatus for moving the second sample holding device. In this case, the connection between the control apparatus and the second movement apparatus may also, for example, be embodied mechanically, electronically and/or optically (cf. the statements already made above).

In a further embodiment of the sample receptacle apparatus, provision is for example made for the fourth axis of rotation to be oriented parallel to one of the following axes, namely the first axis, the second axis, the third axis, the first axis of rotation, the second axis of rotation and the third axis of rotation. As an alternative thereto, provision is made for the fourth axis of rotation to include an angle, which is not 0° and is not 180°, with at least one of the following axes, namely the first axis, the second axis, the third axis, the first axis of rotation, the second axis of rotation and the third axis of rotation.

In one embodiment of the sample receptacle apparatus according to the system described herein, provision is made for the control apparatus to be connected to both the first movement apparatus and the second movement apparatus. In a further embodiment in turn, provision is made, in the process, for at least one of the connections between the control apparatus and one of the two movement apparatuses to be embodied e.g. mechanically, electronically and/or optically. The aforementioned embodiments allow the control apparatus to be used to control firstly the rotation of the first sample holding device about the third axis of rotation. Secondly, the control apparatus can control the rotation of the second sample holding device about the fourth axis of rotation.

In a further embodiment, in turn, of the sample receptacle apparatus according to the system described herein, provision is additionally or alternatively made for the first movement apparatus and the second movement apparatus to be formed by a single movement unit. By way of example, this single movement unit is embodied as a drive unit, which is connected firstly to the first sample holding device and secondly to the second sample holding device using mechanical components such that both the first sample holding device and the second sample holding device can be moved using the drive unit.

BRIEF DESCRIPTION OF THE DRAWINGS

In the following text, the system described herein will be explained in more detail on the basis of exemplary embodiments. In the drawings.

DETAILED DESCRIPTION OF VARIOUS EMBODIMENTS

Figure 1:
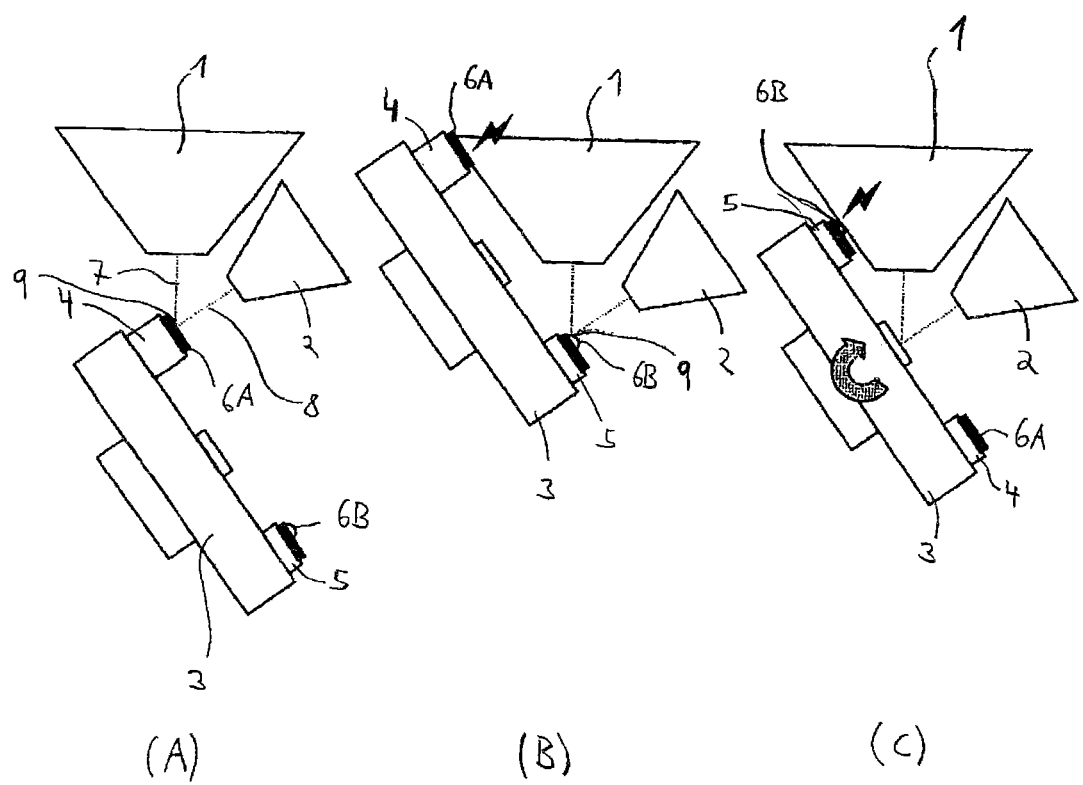
FIG. 1 shows schematic illustrations of particle beam devices according to the prior art.
Figure 2:
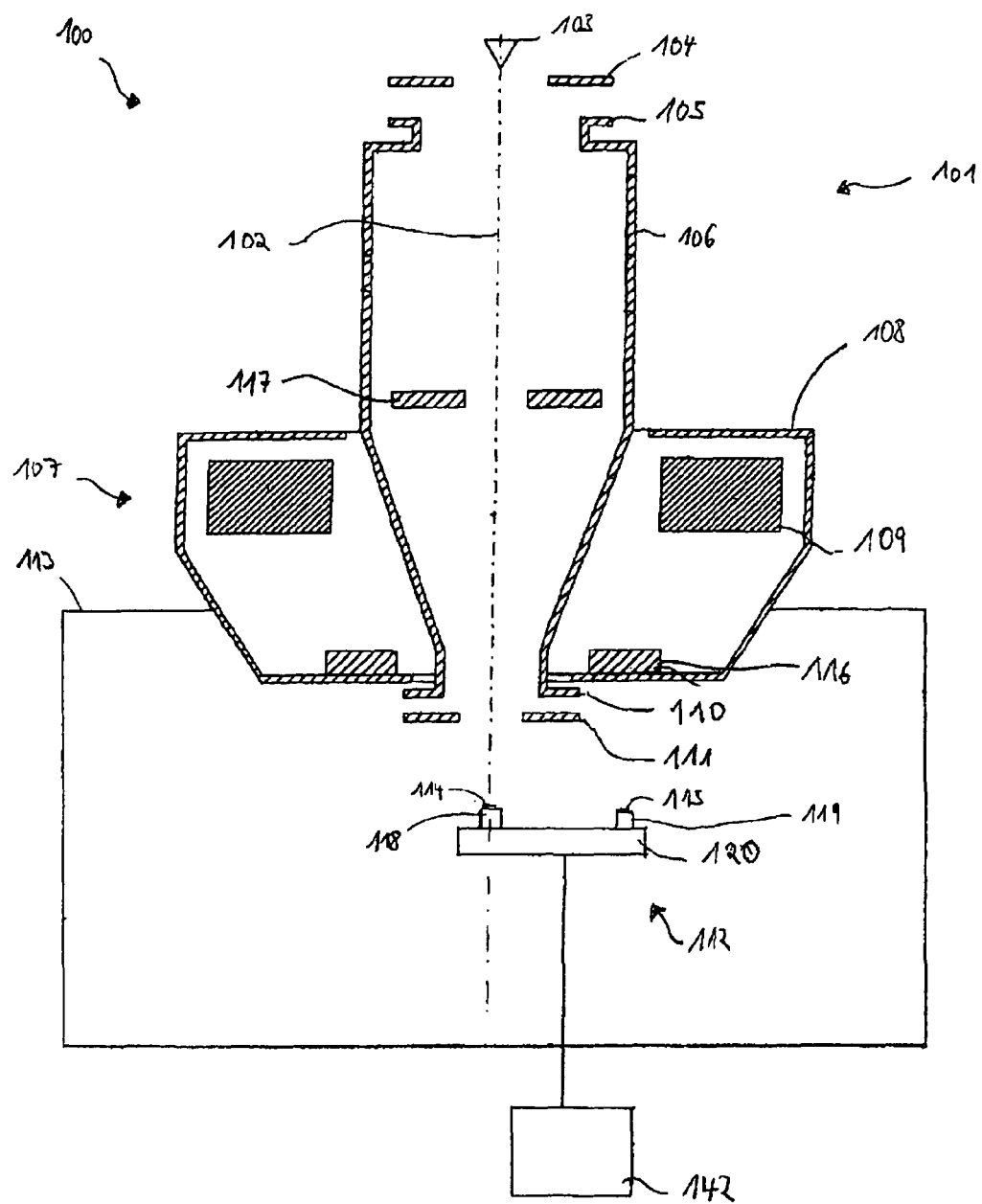
FIG. 2 shows a schematic illustration of a particle beam device with a single particle beam column according to an embodiment of the system described herein.

FIG. 2 shows a schematic illustration of a particle beam device 100 in the form of an SEM with a first particle beam column 101, which is embodied as an electron beam column.

Reference is explicitly made already at this juncture to the fact that the system described herein is not restricted to an SEM. Rather, the system described herein can be used with any particle beam device, more particularly with an ion beam device.

The first particle beam column 101 has a first optical axis 102, a first beam generator in the form of an electron source 103 (cathode), a first electrode 104 in the form of an extraction electrode and a second electrode 105 in the form of an anode, which at the same time forms one end of a first beam guiding tube 106. By way of example, the electron source 103 is a thermal field emitter. Electrons that emerge from the electron source 103 are accelerated to an anode potential as a result of a potential difference between the electron source 103 and the second electrode 105. Accordingly, this provides a first particle beam in the form of an electron beam.

The particle beam device 100 furthermore has a first objective lens 107, which projects into a sample chamber 113 of the particle beam device 100. The first objective lens 107 has a bore, through which the first beam guiding tube 106 is routed. The first objective lens 107 is furthermore provided with pole shoes 108, in which coils 109 are arranged. An electrostatic retardation apparatus is arranged behind the first beam guiding tube 106. Said retardation apparatus has a tubular electrode 110, which forms one end of the first beam guiding tube 106. Furthermore, the electrostatic retardation apparatus has a single electrode 111, which is arranged next to the tubular electrode 110 along the first optical axis 102. A sample holder 112, which will be described in more detail below, is arranged in the sample chamber 113.

Together with the first beam guiding tube 106, the tubular electrode 110 lies at the anode potential, while the single electrode 111, a first sample 114 arranged on the sample holder 112 and a second sample 115 arranged on the sample holder 112 lie at a lower potential compared to the anode potential. It is thus possible to brake the electrons of the first particle beam to a desired energy which is required for analyzing and/or treating the first sample 114 and/or the second sample 115 arranged on the sample holder 112. The first particle beam column 101 moreover has a scanning device 116, by which the first particle beam is deflected such that the first particle beam can be scanned over the first sample 114 and/or the second sample 115 arranged on the sample holder 112.

For the purposes of imaging, secondary electrons and/or backscattered electrons, which are created as a result of the interactions between the first particle beam with the first sample 114 or the second sample 115, are detected using a detector 117 arranged in the first beam guiding tube 106. The signals generated by the detector 117 are transmitted to an electronics unit (not illustrated) for imaging purposes.

In the following text, the sample holder 112 will now be discussed in more detail. The sample holder 112 has a sample receptacle 120, on which a first sample holding device 118 is arranged. The first sample 114 is in turn arranged on the first sample holding device 118. Furthermore, a second sample holding device 119, on which the second sample 115 is arranged, is arranged on the sample receptacle 120. Both the first sample holding device 118 and the second sample holding device 119 can be attached on the sample receptacle 120 in a detachable fashion. As already mentioned above, the number of sample holding devices is variable. Thus, in a further embodiment, provision is made for further sample holding devices to be arranged on the sample receptacle 120.

Figure 3:
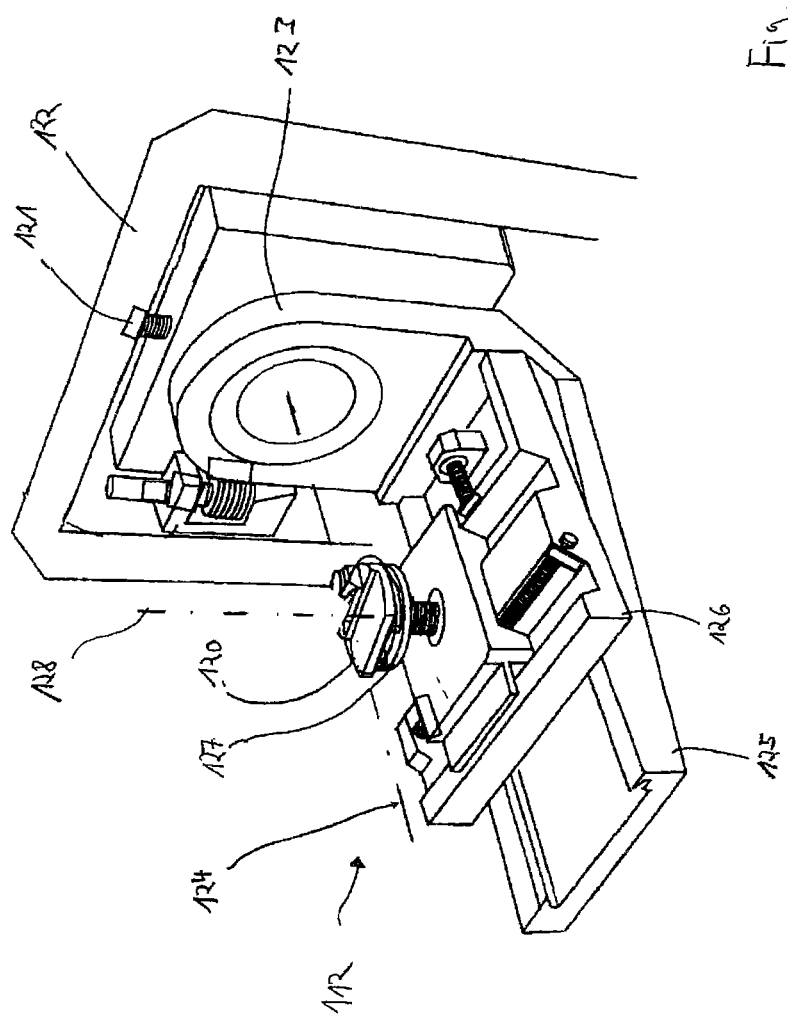
FIG. 3 shows a schematic illustration of a sample holder according to an embodiment of the system described herein.
Figure 4:
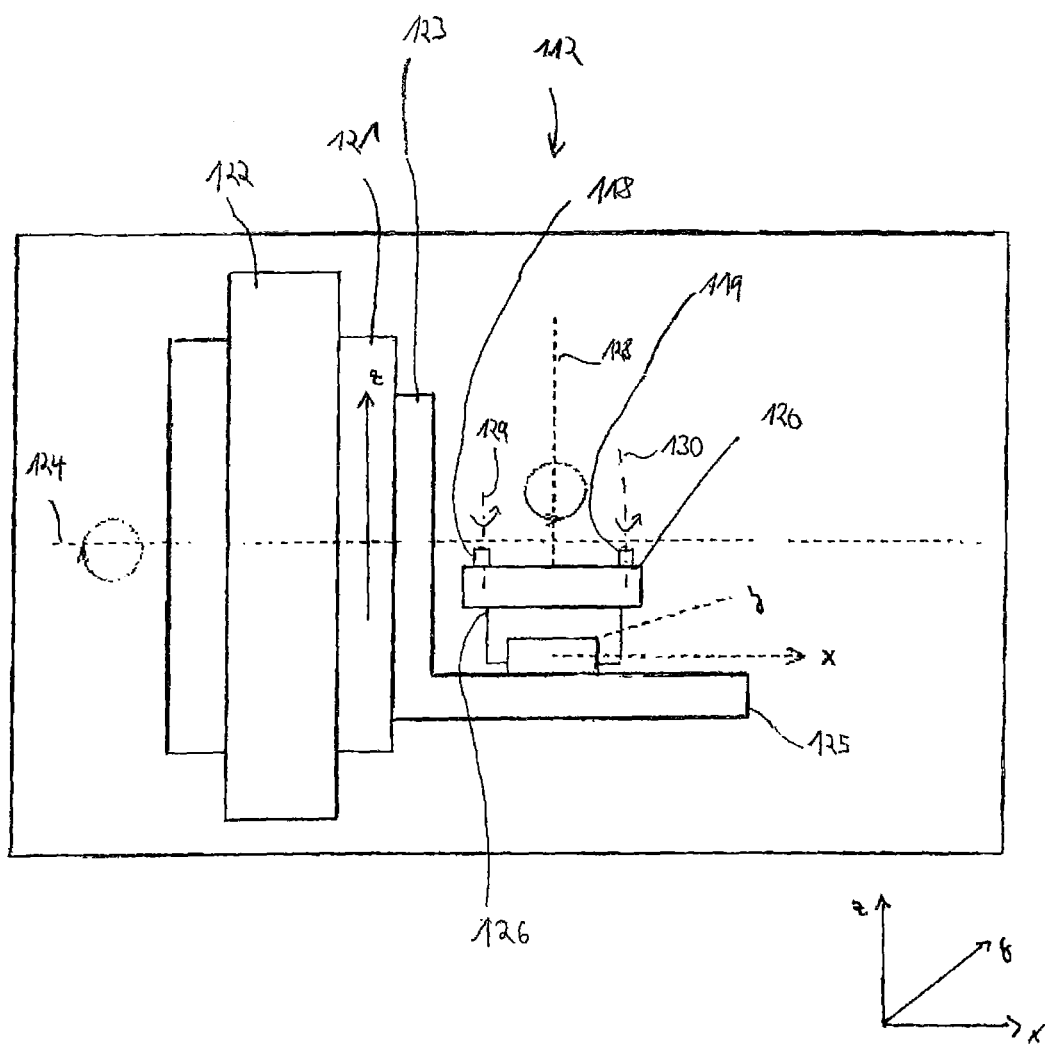
FIG. 4 shows a further schematic illustration of the sample holder according to FIG. 3.

The sample holder 112 is embodied as a moveable sample stage, which is illustrated schematically in FIGS. 3 and 4. The sample holder 112 has the sample receptacle 120, embodied as a planar surface, on which the first sample holding device 118 and the second sample holding device 119 are arranged (these are not illustrated in FIG. 3 for reasons of clarity). The sample holder 112 embodied as a sample stage has movement elements that ensure a movement of the sample holder 112 such that a region of interest on the first sample 114 or on the second sample 115 can be analyzed and/or treated using the first particle beam.

The movement elements are illustrated schematically in FIGS. 3 and 4. The sample holder 112 has a first movement element 121 on a housing 122 of the sample chamber 113 in which the sample holder 112 is arranged. The first movement element 121 enables a movement of the sample holder 112 along the z-axis (first axis of translation). Furthermore, provision is made for a second movement element 123. The second movement element 123 enables a rotation of the sample holder 112 about a first axis of rotation 124, which is also referred to as "tilt axis". Hence the second movement element 123 enables a rotation of the first sample 114 and/or the second sample 115, arranged on the sample receptacle 120, about the first axis of rotation 124.

Arranged on the second movement element 123 there is a third movement element 125, which is embodied as a guide for a slide and ensures that the sample holder 112 is movable in the x-direction (second axis of translation). The aforementioned slide in turn is a further movement element, namely a fourth movement element 126. The fourth movement element 126 is embodied such that the sample holder 112 is movable in the y-direction (third axis of translation). To this end, the fourth movement element 126 has a guide in which a further slide is guided, with the sample receptacle 120 being arranged on this further slide.

The sample receptacle 120 is in turn embodied with a fifth movement element 127 that enables the sample receptacle 120 to be rotatable about a second axis of rotation 128.

The first axis of translation, the second axis of translation and the third axis of translation are respectively aligned perpendicular to one another. Moreover, the second axis of rotation 128 is oriented perpendicularly to the first axis of rotation 124.

As a result of the above-described arrangement, the sample holder 112 of the exemplary embodiment discussed here has the following kinematic chain: first movement element 121 (movement along the z-axis)-second movement element 123 (rotation about the first axis of rotation 124)-third movement element 125 (movement along the x-axis)-fourth movement element 126 (movement along the y-axis)-fifth movement element 127 (rotation about the second axis of rotation 128). However, reference is explicitly made to the fact that the system described herein is not restricted to the aforementioned kinematic chain. Rather, further embodiments provide other arrangements and compositions of the kinematic chain.

In order to control a movement of the individual aforementioned movement elements, provision is made for a control apparatus 142, which is connected to the sample holder 112 and/or at least one of the aforementioned movement elements (cf. FIG. 2). The connection between the control apparatus 142 and the aforementioned movement apparatus(es) can for example be embodied mechanically, electronically and/or optically, with reference being made to the statements already made above.

FIG. 4 shows that the first sample holding device 118 and the second sample holding device 119 are arranged on the sample receptacle 120. The first sample holding device 118 is arranged relative to the sample receptacle 120 in a rotatable fashion about a third axis of rotation 129. Moreover, the second sample holding device 119 is arranged relative to the sample receptacle 120 in a rotatable fashion about a fourth axis of rotation 130. Expressed differently, the first sample 114, which is arranged on the first sample holding device 118, is rotatable relative to the sample receptacle 120. The second sample 115, which is arranged on the second sample holding device 119, is also rotatable relative to the sample receptacle 120.

Both the third axis of rotation 129 and the fourth axis of rotation 130 are oriented substantially parallel to the second axis of rotation 128. Furthermore, the third axis of rotation 129 and the fourth axis of rotation 130 are spaced laterally from the second axis of rotation 128. Moreover, both the third axis of rotation 129 and the fourth axis of rotation 130 are oriented substantially perpendicular to the first axis of rotation 124.

Figure 5:
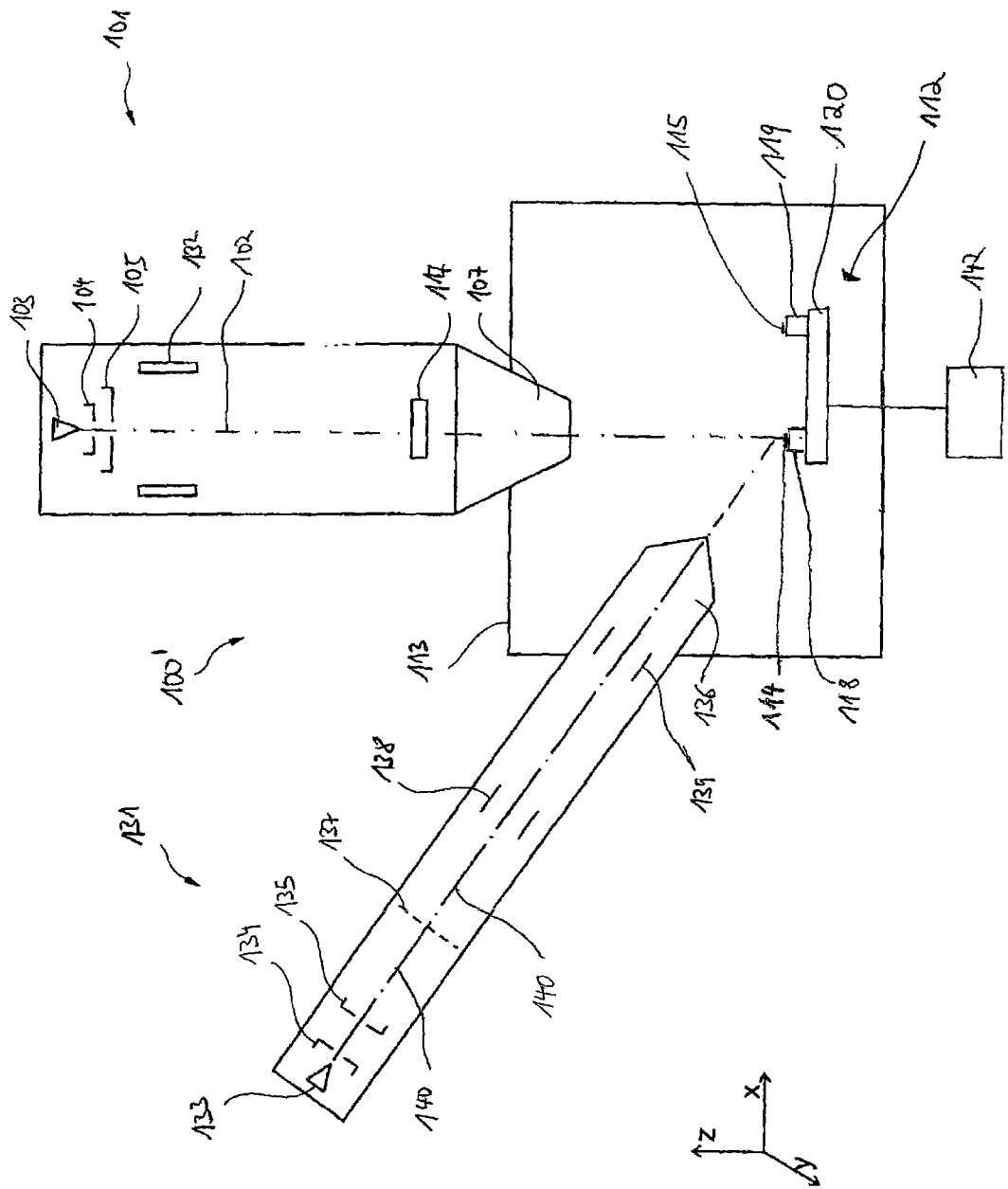
FIG. 5 shows a schematic illustration of a particle beam device with two particle beam columns according to an embodiment of the system described herein.

FIG. 5 shows a further exemplary embodiment of the system described herein, which is implemented using a particle beam device 100'. The particle beam device 100' has two particle beam columns, namely a first particle beam column 101 and a second particle beam column 131, which are arranged on a sample chamber 113. The first particle beam column 101 is embodied as an electron beam column and is arranged vertically with respect to the sample chamber 113. The first particle beam column 101 has the same design as the first particle beam column 101 as per FIG. 2. Accordingly, identical components have been provided with the same reference sign. Additionally a condenser 132 for the first particle beam in the form of the electron beam has been illustrated.

The second particle beam column 131 is embodied as an ion beam column and is arranged at an angle of approximately 50° with respect to the first particle beam column 101. The second particle beam column 131 has an ion beam generator 133 by which ions are generated, which form a second particle beam in the form of an ion beam. The ions are accelerated to a predefinable potential using an extraction electrode 134. The second particle beam then passes through ion optics of the second particle beam column 131, wherein the ion optics has a condenser lens 135 and an arrangement of further lenses 136 that form a second objective lens. The lenses 136 finally generate an ion probe, which is focused on the first sample 114 arranged on the first sample holding device 118 or on the second sample 115 arranged on the second sample holding device 119.

Above the lenses 136 (i.e. in the direction of the ion beam generator 133) there are arranged an adjustable aperture 137, a first electrode arrangement 138 and a second electrode arrangement 139, wherein the first electrode arrangement 138 and the second electrode arrangement 139 are embodied as scanning electrodes.

The second particle beam is scanned over the surface of the first sample 114 or the second sample 115 using the first electrode arrangement 138 and the second electrode arrangement 139, wherein the first electrode arrangement 138 acts in a first direction and the second electrode arrangement 139 acts in a second direction that is opposite to the first direction. As a result there is scanning in e.g. the x-direction. Scanning in a y-direction perpendicular thereto is brought about by further electrodes (not illustrated), which are rotated by 90°, on the first electrode arrangement 138 and on the second electrode arrangement 139.

The distances between the individual elements of the particle beam device 100' illustrated in FIG. 5 have been illustrated in an exaggerated fashion in order to be able to illustrate the individual elements of the particle beam device 100' in an improved fashion. Arranged in turn in the sample chamber 113 there is the sample holder 112, which has an identical embodiment to the sample holder 112 as per FIGS. 2 to 4.

Figure 6:
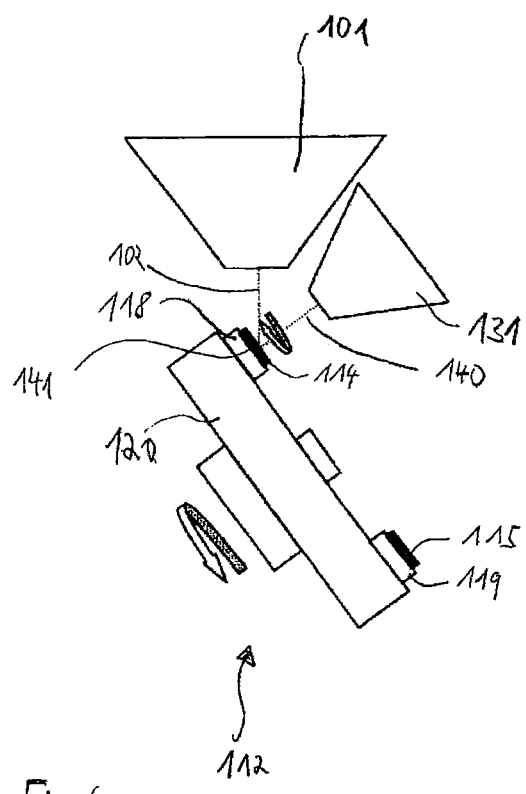
FIG. 6 shows a further schematic illustration of the arrangement of the particle beam columns as per FIG. 5.

FIG. 6 shows the arrangement of the first particle beam column 101 and the second particle beam column 131 as per FIG. 5 in a further schematic illustration with respect to the sample holder 112. The first optical axis 102 and the second optical axis 140 once again intersect at a point of coincidence 141.

In all of the aforementioned exemplary embodiments, provision is made for the control apparatus 142, which controls the movement of the sample holder 112. To this end, the first control apparatus 142 is connected to the sample holder 112, for example via a mechanical, electronic and/or optical connection (cf. the statements already made above).

Furthermore, the aforementioned exemplary embodiments have a first movement apparatus on which the first sample holding device 118 is arranged. The first movement apparatus is used to rotate the first sample holding device 118 about the third axis of rotation 129. By way of example, the first movement apparatus is embodied as a mechanical and/or electronic apparatus. A further embodiment for example also provides for the first movement apparatus to comprise a gearwheel drive, by which the first sample holding device 118 is driven such that the latter rotates about the third axis of rotation 129. The first movement apparatus is connected to the control apparatus 142 in order to control the rotation of the first sample holding device 118 about the third axis of rotation 129.

Moreover, the aforementioned exemplary embodiments have a second movement apparatus on which the second sample holding device 119 is arranged. The second movement apparatus is used to rotate the second sample holding device 119 about the fourth axis of rotation 130. By way of example, the second movement apparatus is also embodied as a mechanical and/or electronic device. Furthermore, a further embodiment for example provides for the second movement apparatus to comprise a gearwheel drive, by which the second sample holding device 119 is driven such that the latter rotates about the fourth axis of rotation 130. The second movement apparatus is connected to the control apparatus 142 in order to control the rotation of the second sample holding device 119 about the fourth axis of rotation 130.

By actuating the first movement apparatus and the second movement apparatus using the control apparatus 142, it is possible to bring the first sample 114 and the second sample 115 into an analysis position and/or treating position. In the analysis position and/or the treating position, the first sample 114 or the second sample 115 can be analyzed and/or treated using the first particle beam and/or the second particle beam.

Figure 7:
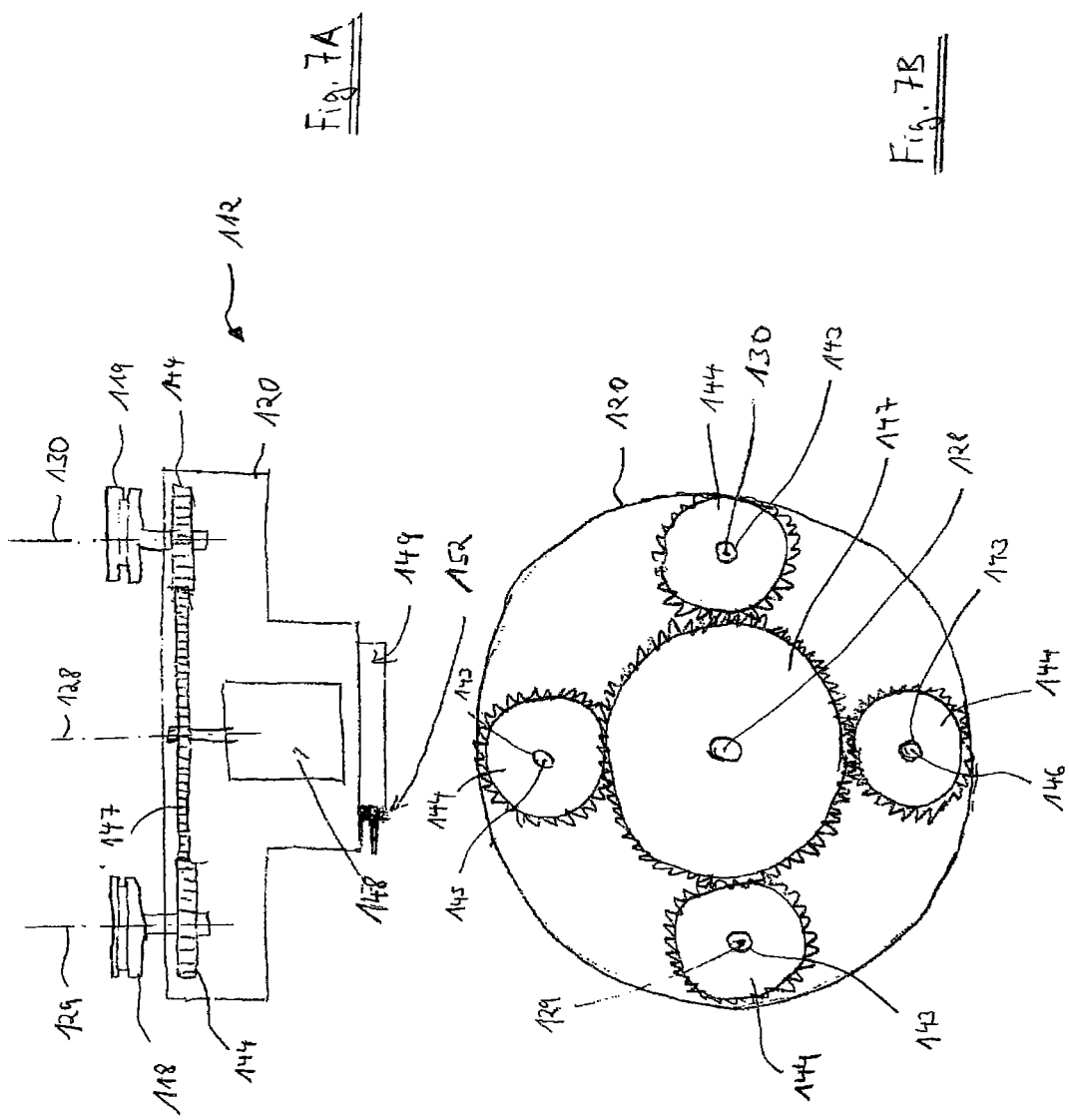
FIG. 7A shows a schematic lateral view of a further sample holder according to an embodiment of the system described herein.
FIG. 7B shows a further schematic illustration of the sample holder according to FIG. 7A.

FIG. 7A shows an exemplary embodiment of the sample holder 112 in a schematic lateral view. The first sample holding device 118 with the first sample 114 (not illustrated in FIG. 7A), the second sample holding device 119 with the second sample 115 (not illustrated in FIG. 7A), a third sample holding device with a third sample (not illustrated) and a fourth sample holding device with a fourth sample (not illustrated) are arranged at an angle of 90° on the sample receptacle 120. Each of the aforementioned sample holding devices is respectively arranged in a holding device receptacle 143 of a gearwheel 144 (cf. FIG. 7B). Hence the exemplary embodiment illustrated in FIG. 7A has four gearwheels 144 that are arranged at an angle of 90° with respect to one another. Furthermore, the centers of the holding device receptacles 143 are the places through which the third axis of rotation 129, the fourth axis of rotation 130, a fifth axis of rotation 145 of the third sample holding device and a sixth axis of rotation 146 of the fourth sample holding device run (cf. FIG. 7B). In the exemplary embodiment illustrated here, the third axis of rotation 129, the fourth axis of rotation 130, the fifth axis of rotation 145 and the sixth axis of rotation 146 are oriented parallel with respect to each other and spaced apart.

Each of the four gearwheels 144 engages into a central drive gearwheel 147, through the center of which the second axis of rotation 128 runs. The central drive gearwheel 147 is connected to a drive unit in the form of a drive motor 148. The drive motor 148 is designed such that it can move the central drive gearwheel 147. As a result, this then also drives the gearwheels 144, and so the aforementioned sample holding devices are likewise rotated.

The sample receptacle 120 is furthermore provided with a first connection element 149, by which the sample receptacle 120 can be arranged on a second connection element 150 of a holding apparatus 151. The holding apparatus 151 is illustrated schematically in FIG. 8. By way of example, both the first connection element 149 and the second connection element 150 are embodied like a dovetail.

Figure 8:
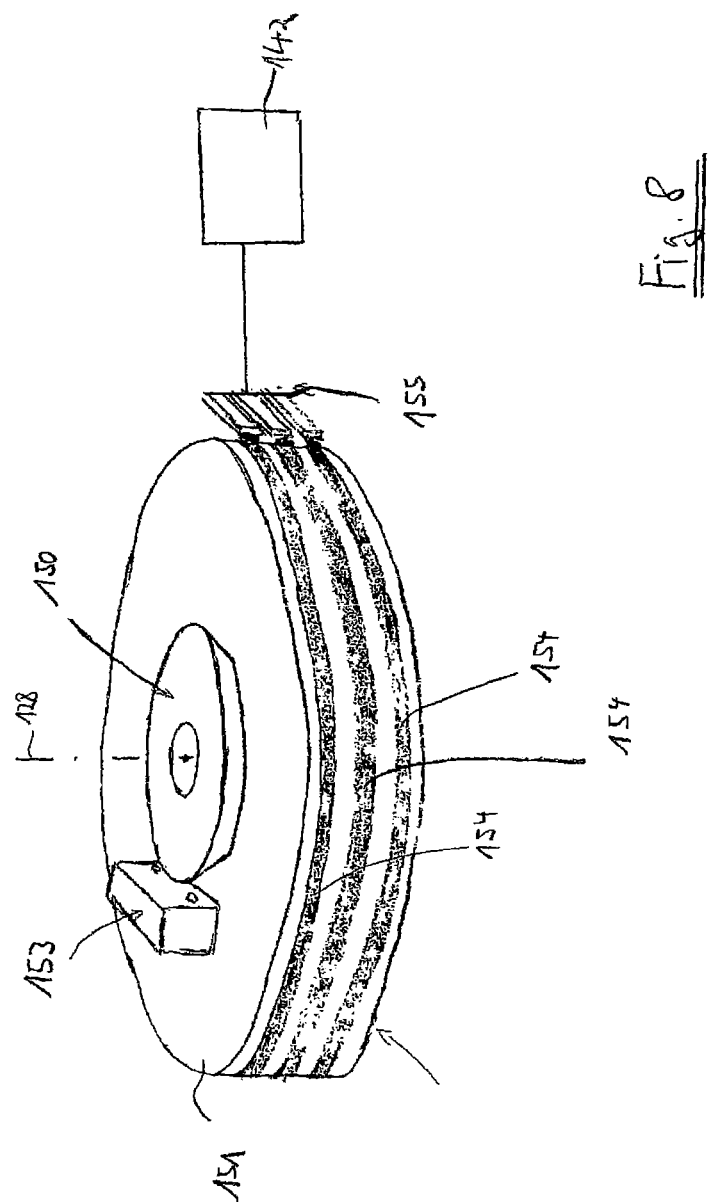
FIG. 8 shows a schematic illustration of a holding apparatus of the sample holder according to FIG. 7A.

If the first connection element 149 is connected to the second connection element 150, a plug 152 of the sample receptacle 120 (cf. FIG. 7A) is connected to a socket 153 of the holding apparatus 151 (cf. FIG. 8). This plug-in connection enables the actuation of the drive motor 148. The holding apparatus 151 has a circular design and on the circumference thereof has circular contacts 154 that are in contact with sliding contacts 155, which are connected to the control apparatus 142. This allows the drive motor 148 to be actuated using the control apparatus 142.

The second connection element 150 has a rotationally symmetric design and has a center through which the second axis of rotation 128 runs.

In a further embodiment provision is made for the drive motor 148 to be provided with at least one measurement apparatus, as a result of which it is possible to determine the rotational angle of the aforementioned sample holding devices.

In the above-described embodiments, the first sample holding device 118, the second sample holding device 119, the third sample holding device and/or the fourth sample holding device is/are arranged in such a movable fashion that if the first sample holding device 118, the second sample holding device 119, the third sample holding device and/or the fourth sample holding device is/are moved, then object details that are analyzed and/or treated on the respective samples of the respective sample holding devices do not leave the raster area. To this end, provision is made for a movement of at least one of the axes in the kinematic chain is initiated when one of the aforementioned sample holding devices is turned such that the analyzed and/or treated object detail on the respective sample remains in the raster area and hence in the illustrated image. To this end, the aforementioned sample holding device has a property that is known by the term "computer eucentric". After installing the sample receptacle 120 or the sample holder 120, the deviations (distances) between the second axis of rotation 128 and the optical axis 102 of the first particle beam column 101 are respectively established and stored using a calibration method.

Accordingly, it is additionally also possible to establish and store the deviations (distances) of every one of the third axis of rotation 129, the fourth axis of rotation 130 and the further axes of rotation from the optical axis 102 of the first particle beam column 101. Then a calibration object, which has a pronounced sample point, can be respectively arranged on the aforementioned sample holding device. Subsequently, images are recorded and evaluated in the case of a slight enlargement of the particle beam device 100 (i.e. in the case of a large raster area) at different known rotational positions about the second axis of rotation 128, about the third axis of rotation 129, about the fourth axis of rotation 130 and about possible further axes of rotation. Now, the path that the pronounced sample point travels during a rotation about one of the respective axes of rotation is established from this evaluation. If the enlargement is known, this makes it possible to establish the deviation (the distance) between each of the axes of rotation (namely the second axis of rotation 128, the third axis of rotation 129, the fourth axis of rotation 130 and each further axis of rotation) and the optical axis 102 of the first particle beam column 101 according to magnitude and direction. If images of a real sample, e.g. the first sample 114 or the second sample 115, are now subsequently recorded, the present, stored values of the deviations between the respective aforementioned axes of rotation, around which there is rotation, and the rotational angles, about which there is rotation in each case, can be used by the control apparatus 142 of the particle beam device 100 in order to establish the paths that the sample holder 112 has to be moved along the first axis and the second axis so that a point on the optical axis 102 of the first particle beam column 101 moves back by the (linear) movements along the first axis and the second axis by precisely the same path that said point moves forward as a result of the rotation about the second axis of rotation 128, the third axis of rotation 129, the fourth axis of rotation 130 and/or further axes of rotation. The (linear) drives along the first axis and the second axis are then actuated by the control apparatus 142 of the particle beam device 100 such that the combined linear movement along the first axis and the second axis precisely compensates for the movement that a point on the optical axis 102 of the first particle beam column 101 experiences as a result of the rotational movement about the second axis of rotation, about the third axis of rotation, about the fourth axis of rotation and/or about each further axis of rotation.

Provision is also made in the aforementioned exemplary embodiments for the first sample holding device 118, the second sample holding device 119, the third sample holding device and/or the fourth sample holding device to be arranged in a movable fashion such that if the first sample holding device 118 or the second sample holding device 119 or the third sample holding device or the fourth sample holding device moves, a predetermined point on the first sample 114 or on the second sample 115 or on the third sample or on the fourth sample remains stationary relative to the first optical axis 102 of the first particle beam column 101 or relative to the second optical axis 140 of the second particle beam column 131. As an alternative thereto, provision is made for the sample holder 112 to be arranged in a movable fashion such that if the sample holder 112 is moved, a predetermined point on the first sample 114 or on the second sample 115 or on the third sample or on the fourth sample remains stationary relative to the first optical axis 102 of the first particle beam column 101 or relative to the second optical axis 140 of the second particle beam column 131.

The exemplary embodiments illustrated in the figures have all the advantages and effects that were already illustrated above.

Various embodiments discussed herein may be combined with each other in appropriate combinations in connection with the system described herein. Additionally, in some instances, the order of steps in the flowcharts, flow diagrams and/or described flow processing may be modified, where appropriate. Further, various aspects of the system described herein may be implemented using software, hardware, a combination of software and hardware and/or other computer-implemented modules or devices having the described features and performing the described functions. Software implementations of the system described herein may include executable code that is stored in a computer readable medium and executed by one or more processors. The computer readable medium may include a computer hard drive, ROM, RAM, flash memory, portable computer storage media such as a CD-ROM, a DVD-ROM, a flash drive and/or other drive with, for example, a universal serial bus (USB) interface, and/or any other appropriate tangible or non-transitory computer readable medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A particle beam device, comprising:
   a sample chamber;
   a first particle beam column with a first optical axis, wherein the first particle beam column has a first beam generator for generating a first particle beam and a first objective lens for focusing the first particle beam;
   at least one detector for detecting interaction particles that are created when the first particle beam impinges on a first sample that is to be arranged in the sample chamber;
   a first sample holding device for holding the first sample arranged in the sample chamber, wherein the first sample holding device is arranged on a sample holder, wherein the sample holder is arranged in a movable fashion along at least a first axis and along at least a second axis, wherein the first axis and the second axis are arranged at a first angle with respect to one another, which differs from 0° and 180°, wherein the sample holder is arranged in a rotatable fashion about at least a first axis of rotation and about at least a second axis of rotation, wherein the first axis of rotation and the second axis of rotation are arranged at a second angle with respect to one another, which differs from 0° and 180°, wherein the first sample holding device rotates independently from the sample holder about a third axis of rotation, wherein the third axis of rotation and the second axis of rotation are at least in part arranged laterally offset with respect to one another, and wherein the third axis of rotation about which the first sample holding device is rotated and the second axis of rotation about which the sample holder is rotated, are arranged parallel to one another; and
   a control apparatus, wherein the first sample holding device is rotatable about the third axis of rotation into at least one of: an analysis position or a treating position using the control apparatus.

2. The particle beam device according to claim 1, wherein the third axis of rotation and the second axis of rotation are arranged separated laterally from one another.

3. The particle beam device according to claim 1, wherein the sample holder is arranged in a movable fashion along at least a third axis, wherein the first axis and the third axis are arranged at a third angle with respect to one another, which differs from 0° and 180°, and wherein the second axis and the third axis are arranged at a fourth angle with respect to one another, which differs from 0° and 180°.

4. The particle beam device according to claim 1, wherein the first sample holding device is arranged on a first movement apparatus, and wherein the control apparatus is connected to the first movement apparatus for moving the first sample holding device.

5. The particle beam device according to claim 1, wherein the first sample holding device is arranged in such a movable fashion that, when the first sample holding device is moved, a first predetermined position on a first sample remains stationary relative to the first optical axis of the first particle beam column.

6. The particle beam device according to claim 1, further comprising:
   at least a second sample holding device for holding a second sample, wherein the second sample holding device is arranged on the sample holder, wherein the second sample holding device is arranged relative to the sample holder in a rotatable fashion about a fourth axis of rotation, wherein the fourth axis of rotation, the third axis of rotation and the second axis of rotation are at least partly arranged laterally offset with respect to one another, wherein the second sample holding device is arranged on a second movement apparatus, and wherein the control apparatus is connected to the second movement apparatus for moving the second sample holding device.

7. The particle beam device according to claim 6, wherein at least one of the following is provided:
   (i) the fourth axis of rotation, the third axis of rotation and the second axis of rotation are arranged separated laterally from one another; or
   (ii) the fourth axis of rotation, the third axis of rotation and the second axis of rotation are arranged parallel to one another.

8. The particle beam device according to claim 6, wherein at least one of the following is provided:
   (i) the control apparatus is connected to both the first movement apparatus and the second movement apparatus; or
   (ii) the first movement apparatus and the second movement apparatus are formed by a single movement unit.

9. The particle beam device according to claim 1, wherein the first particle beam column is embodied as an electron beam column or as an ion beam column.

10. The particle beam device according to claim 1, further comprising:
    a second particle beam column with a second optical axis, wherein the second particle beam column has a second beam generator for generating a second particle beam and a second objective lens for focusing the second particle beam.

11. The particle beam device according to claim 10, wherein the first sample holding device is arranged in such a movable fashion that, when the first sample holding device is moved, a second predetermined position on a first sample remains stationary relative to the second optical axis of the second particle beam column.

12. The particle beam device according to claim 11, wherein a second sample holding device is arranged in such a movable fashion that, when the second sample holding device is moved, a third predetermined position on a second sample remains stationary relative to the first optical axis of the first particle beam column.

13. The particle beam device according to claim 12, wherein the second sample holding device is arranged in such a movable fashion that, when the second sample holding device is moved, a fourth predetermined position on a second sample remains stationary relative to the second optical axis of the second particle beam column.

14. The particle beam device according to claim 10, wherein one of the following features is provided:

(i) the first particle beam column is embodied as an electron beam column and the second particle beam column is embodied as an ion beam column;
(ii) the first particle beam column is embodied as an ion beam column and the second particle beam column is embodied as an electron beam column;
(iii) the first particle beam column is embodied as an ion beam column and the second particle beam column is embodied as an ion beam column; or
(iv) the first particle beam column is embodied as an electron beam column and the second particle beam column is embodied as an electron beam column.

15. A sample receptacle apparatus for a particle beam device, comprising:
a first sample holding device for holding a first sample;
a sample holder on which the first sample holding device is arranged, wherein the sample holder is arranged in a movable fashion along at least a first axis and along at least a second axis, wherein the first axis and the second axis are arranged at a first angle with respect to one another, which differs from 0° and 180°, wherein the sample holder is arranged in a rotatable fashion about at least a first axis of rotation and about at least a second axis of rotation, wherein the first axis of rotation and the second axis of rotation are arranged at a second angle with respect to one another, which differs from 0° and 180°, wherein the first sample holding device rotates independently from the sample holder about a third axis of rotation, and wherein the third axis of rotation and the second axis of rotation are at least in part arranged laterally offset with respect to one another, and wherein the third axis of rotation about which the first sample holding device is rotated and the second axis of rotation about which the sample holder is rotated, are arranged parallel to one another; and
a control apparatus, wherein the first sample holding device is rotatable about the third axis of rotation into at least one of: an analysis position or a treating position using the control apparatus.

16. The sample receptacle apparatus according to claim 15, wherein at least one of the following is provided:
(i) the third axis of rotation and the second axis of rotation are arranged separated laterally from one another; or
(ii) the sample holder is arranged in a movable fashion along at least a third axis, wherein the first axis and the third axis are arranged at a third angle with respect to one another, which differs from 0° and 180°, and wherein the second axis and the third axis are arranged at a fourth angle with respect to one another, which differs from 0° and 180°.

17. The sample receptacle apparatus according to claim 15, wherein the first sample holding device is arranged on a first movement apparatus, and wherein the control apparatus is connected to the first movement apparatus for moving the first sample holding device.

18. The sample receptacle apparatus according to claim 15, further comprising:
at least a second sample holding device for holding a second sample, wherein the second sample holding device is arranged on the sample holder, wherein the second sample holding device is arranged relative to the sample holder in a rotatable fashion about a fourth axis of rotation, wherein the fourth axis of rotation, the third axis of rotation and the second axis of rotation are at least partly arranged laterally offset with respect to one another, wherein the second sample holding device is arranged on a second movement apparatus, and wherein the control apparatus is connected to the second movement apparatus for moving the second sample holding device.

19. The sample receptacle apparatus according to claim 18, wherein at least one of the following is provided:
(i) the fourth axis of rotation, the third axis of rotation and the second axis of rotation are arranged separated laterally from one another; or
(ii) the fourth axis of rotation, the third axis of rotation and the second axis of rotation are arranged parallel to one another.

20. The sample receptacle apparatus according to claim 18, wherein one of the following features is provided:
(i) the control apparatus is connected to both the first movement apparatus and the second movement apparatus; or
(ii) the first movement apparatus and the second movement apparatus are formed by a single movement unit.

21. The particle beam device according to claim 1, further comprising:
at least a second sample holding device for holding a second sample, wherein the second sample holding device is arranged on the sample holder independently of the first sample holding device and the first and second sampling devices rotate together about the first axis of rotation and about the second axis of rotation.

22. The sample receptacle apparatus according to claim 15, further comprising:
at least a second sample holding device, arranged on the sample holder, for holding a second sample, wherein the first and second sample holding devices rotate together about the first axis of rotation and about the second axis of rotation.

23. A particle beam device, comprising:
a sample chamber;
a particle beam column with an optical axis, wherein the particle beam column has a beam generator for generating a particle beam and an objective lens for focusing the particle beam;
at least one detector for detecting interaction particles that are created when the particle beam impinges on a sample that is to be arranged in the sample chamber;
a sample holding device for holding the sample arranged in the sample chamber, wherein the sample holding device is arranged on a sample holder, wherein the sample holder is arranged in a movable fashion along at least a first axis and along at least a second axis, wherein the first axis and the second axis are arranged at a first angle with respect to one another, which differs from 0° and 180°, wherein the sample holder is arranged in a rotatable fashion about at least a first axis of rotation and about at least a second axis of rotation, wherein the first axis of rotation and the second axis of rotation are arranged at a second angle with respect to one another, which differs from 0° and 180°, wherein the sample holding device rotates independently from the sample holder about a third axis of rotation, wherein the third axis of rotation and the second axis of rotation are at least in part arranged laterally offset with respect to one another, and wherein the third axis of rotation about which the sample holding device is rotated and the second axis of rotation about which the sample holder is rotated, are arranged parallel to one another; and
a control apparatus, wherein the sample holding device is rotatable about the third axis of rotation into at least one of: an analysis position or a treating position using the control apparatus and wherein the sample is maintained in a raster area during movement of the sample holding device.

24. The particle beam device according to claim 23, wherein maintaining the sample in the raster area includes initially establishing and storing distances between the second axis of rotation and the optical axis.

25. A method of treating or analyzing a sample, comprising:
- generating a particle beam;
- focusing the particle beam along a beam column with an optical axis;
- detecting interaction particles that are created when the particle beam impinges on a sample arranged in a sample chamber;
- holding the sample with a sample holding device being arranged on a sample holder, wherein the sample holder is arranged in a movable fashion along at least a first axis and along at least a second axis, wherein the first axis and the second axis are arranged at a first angle with respect to one another, which differs from 0° and 180°, wherein the sample holder is arranged in a rotatable fashion about at least a first axis of rotation and about at least a second axis of rotation, wherein the first axis of rotation and the second axis of rotation are arranged at a second angle with respect to one another, which differs from 0° and 180°, wherein the sample holding device rotates independently from the sample holder about a third axis of rotation, wherein the third axis of rotation and the second axis of rotation are at least in part arranged laterally offset with respect to one another, and wherein the third axis of rotation about which the sample holding device is rotated and the second axis of rotation about which the sample holder is rotated, are arranged parallel to one another;
- rotating the sample holding device about the third axis of rotation into at least one of: an analysis position or a treating position; and
- maintaining the sample in a raster area during movement of the sample holding device.

26. The method according to claim 25, wherein maintaining the sample in the raster area includes initially establishing and storing distances between the second axis of rotation and the optical axis.

* * * * *